United States Patent [19]

Tosti

[11] Patent Number: 4,584,768
[45] Date of Patent: Apr. 29, 1986

[54] METHOD OF MAKING HIGH CAPACITIVE MULTILAYER CONDUCTIVE BARS

[75] Inventor: Giorgio Tosti, Segrate, Italy

[73] Assignee: Mecondor S.p.A., Milan, Italy

[21] Appl. No.: 627,349

[22] Filed: Jul. 3, 1984

[30] Foreign Application Priority Data

Jul. 6, 1983 [IT] Italy ............................. 21954 A/83

[51] Int. Cl.⁴ .......................................... H01R 43/00
[52] U.S. Cl. ...................................... 29/872; 29/830; 174/72 B
[58] Field of Search ............... 174/72 B; 29/825, 830; 228/263 R, 263.11; 420/558, 559

[56] References Cited

U.S. PATENT DOCUMENTS

| | | | |
|---|---|---|---|
| 4,236,038 | 11/1980 | Taylor | 29/830 X |
| 4,381,423 | 4/1983 | Taylor | 174/72 B |
| 4,394,532 | 7/1983 | Aguayo | 29/825 X |
| 4,399,321 | 8/1983 | Gottlieb | 174/72 B |
| 4,420,653 | 12/1983 | Fukuda et al. | 29/825 X |
| 4,430,522 | 2/1984 | Bader | 174/72 B |
| 4,436,953 | 3/1984 | Gottlieb | 174/72 B |
| 4,440,972 | 4/1984 | Taylor | 174/72 B |
| 4,515,304 | 5/1985 | Berger | 228/180.1 X |

FOREIGN PATENT DOCUMENTS 2095892 10/1982 United Kingdom ............. 174/72 B

Primary Examiner—Howard N. Goldberg
Assistant Examiner—Carl J. Arbes
Attorney, Agent, or Firm—George W. Rauchfuss, Jr.; G. Kendall Parmelee

[57] ABSTRACT

A method for manufacturing high capacitive multilayer conductive bars is described. It comprises at least two conductive elements (14,16), one capacitive element (12) between them, and further inner and/or outer dielectric elements (13,113,18,20). The electrical connection between the capacitive element (12) and the conductive element (14,16) is realized by a solder alloy material (30), preferably in the form of a soldering alloy material.

The mechanical connection between the outer (18,20) respectively the inner dielectric elements (13,113) and the conductive elements (14,16) is established by a nonconductive bonding material (13',113',22,24). Mechanical as well as electrical connection is made in the same operation step. The multilayer conductive bar has a great reliability. It is used for power and/or signal distribution in electronics, for example printed circuits and other high density components.

19 Claims, 5 Drawing Figures

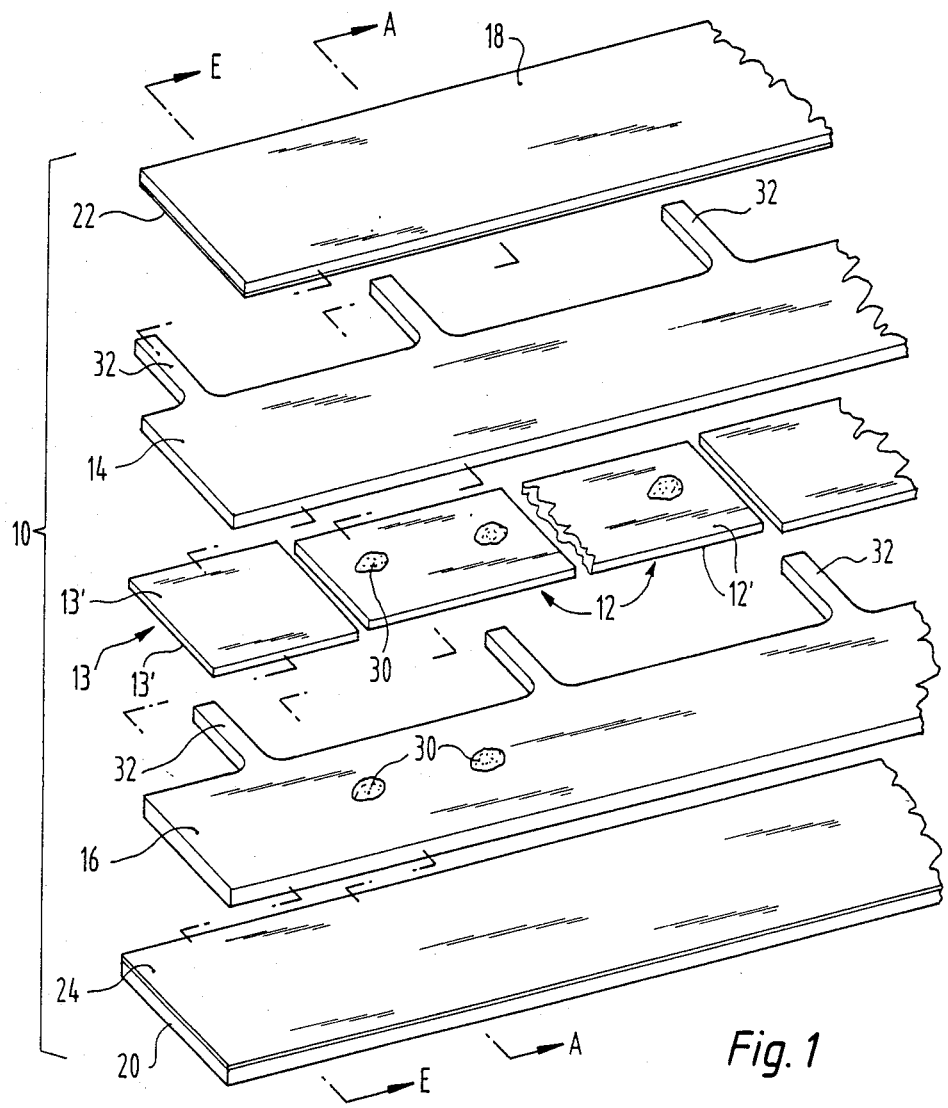
Fig. 1
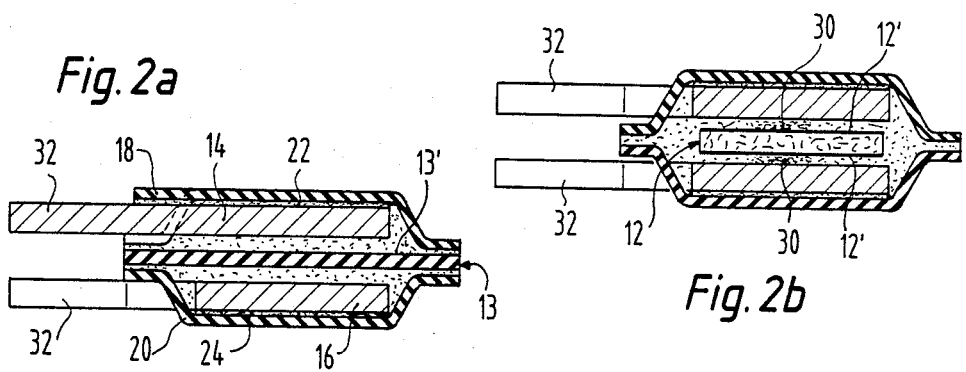
Fig. 2a
Fig. 2b

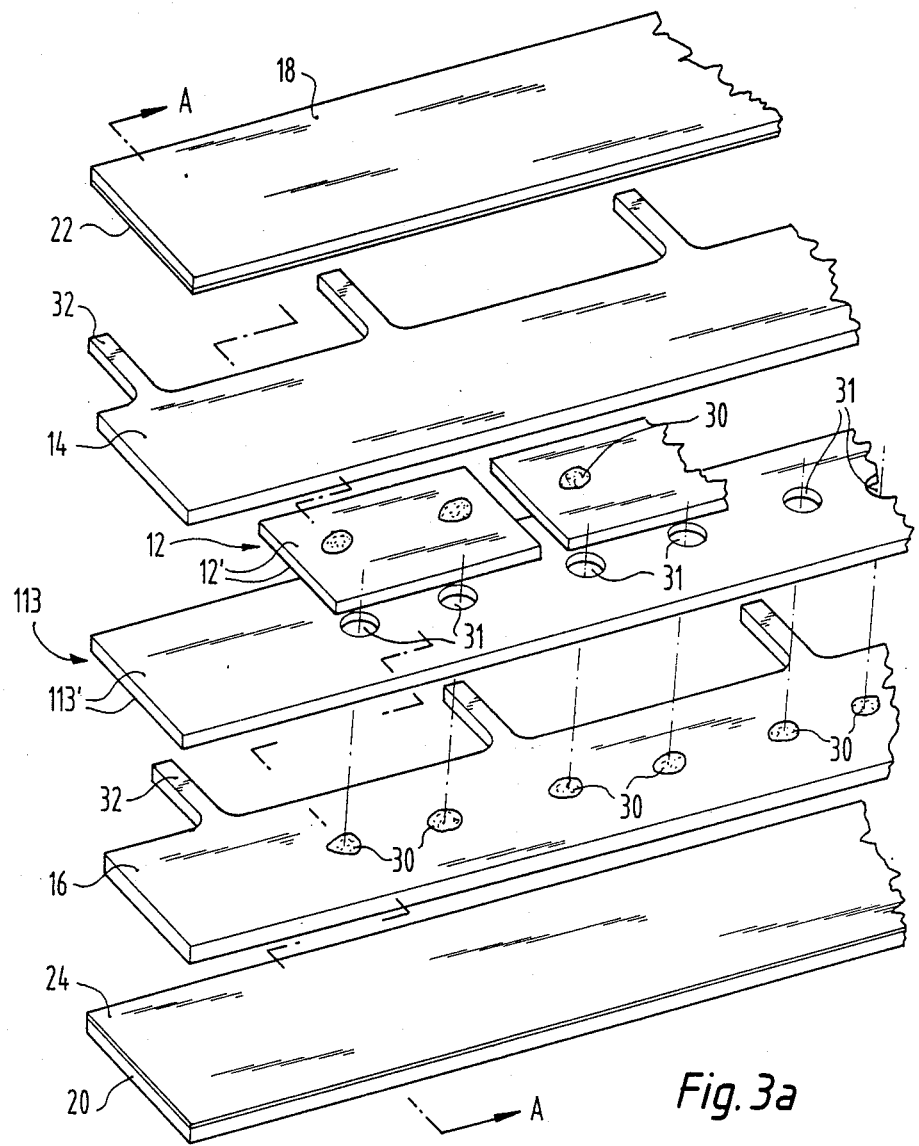
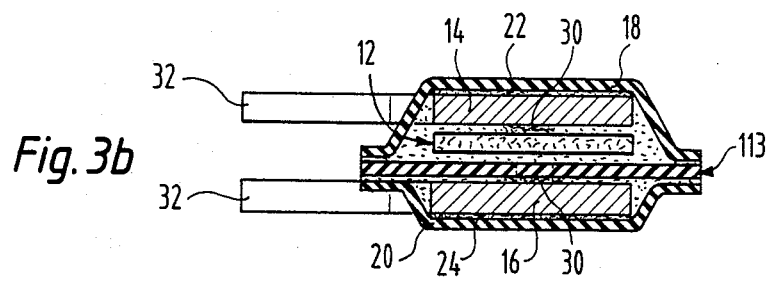

METHOD OF MAKING HIGH CAPACITIVE MULTILAYER CONDUCTIVE BARS

The invention relates to a method for manufacturing high capacitive multilayer conductive bars comprising capacitive elements, such as bus bars and to high capacitive multilayer conductive bars producible by such method.

The term "bus bars" is herein used for components with wide duty, mainly used for power and/or signal distribution in electronics, for example printed circuits and other high density components.

The bus bars comprise generally two or more spaced apart conductive elements for feeding the current, usually tinned copper or brass, having a thickness ranging e.g. from about 0.12 mm to about 0.50 mm. They carry a plurality of distribution pins extending therefrom, these pins allowing electrical connections between the conductive elements and the paths of the printed circuit board. In such bus bars, the room between the conductive elements is usually filled with a dielectric for providing a distributed capacitance along the bus bar. So, the bus bar is useful to eliminate transients due to voltage drops and/or to reduce the inherent noise.

In prior art bus bars an insulating film or synthetic paper with a thickness usually ranging from 25 to 125 $\mu$m is positioned between the conductive elements. Suitable dielectrics are PTFE film ("Teflon"), aramide dielectric paper (e.g. "Nomex"), polyester film (e.g. "Mylar"), polyimid film (e.g. "Kapton") and PVF film (e.g. "Tedlar"). Their relative dielectric constants range from 2 to 9. Bus bars of this type have relatively low capacitance.

The capacitance per square unit of the bus bar is proportional to the dielectric constant and inversely proportional to the thickness of the dielectric. Reducing the thickness for increasing the capacitance is limited because of the dielectric strength of the material. Higher capacitance at same thickness can be reached with dielectrics having a higher relative dielectric constant.

In the art there has been for many years the problem of increasing capacitance without changing the thickness and/or the volume of the dielectric.

Ceramic chips have been used for improving the dielectric constant. They reach dielectric constant values much higher than those above mentioned. Particularly, with barium or strontium titanate ceramics it has been possible to have relative dielectric constants reaching values of 100,000 and more. These chips, precisely $BaTiO_3$ (barium titanate) and $SrTiO_3$ (strontium titanate), are easily available on the market in multilayer or monolayer type. In the second case they can have a parallelepiped shape with very small thickness e.g. 0.2 mm. The major sides, having a width e.g. from 3.5 to 5 mm and a length e.g. from 5 to 35 mm, are metallized by laying a conductive film or by sputtering or the like, whereas the edges are not metallized. These chips are the actual capacitors.

Metallization is made of silver or nickel or another suitable metal, with usual vacuum laying methods; the metal film has a thickness up to some $\mu$m providing a continous conductive layer on the major sides.

The cross section of the continous conductive layer on the major sides of the chips can be small, since the layer does not feed the main current, but is mostly crossed by the variable current due to the noise power generated by the active components. This noise power, even if sometimes very detrimental, reaches high values only for shortest instants, without producing considerable heat in the capacitive ceramics. An appreciable cross section of the conductive layer is, however, useful for keeping the electrical series resistance low and for lowering the equivalent series resistance of the capacitors. From U.S. Pat. Nos. 4,236,046 and 4,266,091 bus bars are known in which the electrical connection between the metallized ceramic chips and the conductive bars is provided by a conductive adhesive. The use of a conductive adhesive can cause serious reliability problems owing to the short circuit paths occuring between the opposite faces of the chips either during the manufacturing process or during handling or use of the device. A short circuit can occur because of the low viscosity of the adhesive which, under the double effect of temperature (usually ranging from 140° C. to 205° C.) and pressure during the lamination process, can cause some excess flow of the adhesive between the conductive bars. In U.S. Pat. No. 4,236,038, to obviate this disadvantage, the metallized ceramic chips are sealed to the outward conductive bars by means of a nonconductive adhesive, while the surfaces of the chips facing the inwardly facing surfaces of the plate bars are provided with a rough finish in order to make electrical contacts between the conductive bar and the metallized layer of the chip.

Such an electrical connection is, however, uncertain and unreliable either due to some excess amount of adhesive covering the inwardly facing surfaces of the multilayer bus bar assembly, or due to the property of the adhesive—typically a thermoplastic material—which, when heated up to its softening point, starts flowing thus leading the electrical contacts to fail. In any case, it is difficult to select an adequate amount of adhesive.

Another prior art multilayer bus bar incorporating ceramic chips is known from GB-A-20 96 820. The bus bar assembly comprises discrete capacitive elements, e.g. $BaTiO_3$ having conductive layers e.g. of Ag, which are electrically connected to the bus bar conductors. The electrical connection may be established by solder and the conductors may be covered with plastics. In another embodiment the bus bar conductors are laminated to an insulating spacer having apertures therein to receive the conductively coated discrete capacitors. Printed conductive tracks on the insulating spacer make the connection between the bus conductors and the conductive layers. In an alternative embodiment the bus conductors are printed tracks on plastic sheets adhered to an apertured plastic spacer with conductively coated capacitors in the apertures and conductive adhesive between the conducitve layers and the bus conductors.

In any case these methods to manufacture such bus bars are complicate and require a plurality of process steps. The reliability of an electrical connection made by a mechanical contact is poor, because the surfaces of the conductive tracks are liable to oxidation. These oxide layers are bad conductors. The use of a conductive adhesive may cause the problem above mentioned in connection with U.S. Pat. Nos. 4,236,046 and 4,266,091.

The invention as claimed is intended to provide a simple and economic method for manufacturing high capacitive multilayer conductive bars, in which the required electrical and mechanical connections between the various elements of the bus bars are safe and reliable even under extreme conditions, such as high temperature or mechanical stress. It is another object to provide such bars with relatively low equivalent series resistance of the inner capacitors and great effectiveness in reducing inherent noise.

The invention is characterised by the features of the claims. The advantages provided by the invention consist mainly in that the mechanical and the electrical connections are established in the best form by using two different bonding materials. On the one hand the solder alloy material is used because it is qualified for establishing best electrical connection which is durable and additionally has a low impedance. On the other hand, the solder alloy material is used together with a best possible non-conductive bonding material that establishes the mechanical connection, whereby this demand is accomplished in the best manner. The non-conductive bonding material may be applied abundantly without disturbing the function of the multilayer conductive bars. Moreover, every space within the conductive bars assembly is preferably filled by the non-conductive bonding material so that the assembly is stable and compact and has a good reliability.

According to the present invention the conductive, the capacitive and the dielectric elements together with the soldering alloy as well as the non-conductive bonding materials are laminated during a single hot pressing step. Therefore, the solder/alloy material is placed between the conductive elements and the intermediate capacitive elements, and the non-conductive bonding material is placed on the surfaces of the various dielectric elements.

The bonding materials establishing the mechanical and electrical connections are selected in view of similar properties as regards process temperature and/or pressure. The non-conductive bonding material is preferably a thermosetting or thermoplastic adhesive, having an activation temperature between about 150° C. and 200° C. The bonding via the thermoplastic adhesive is preferably performed at a softening temperature of about 150° C. The bonding via the thermosetting adhesive is preferably performed at a polymerazation temperature of about 185° C. Both adhesives are suitable materials for adhering metal as well as dielectric. The so performed mechanical connection is durable and certain. The soldering alloy material is preferably a solder paste, a solder preform material or a preform welding material having a melting point between about 140° C. and 200° C., i.e. soldering rather than brazing. Solder materials usually lead-tin alloys join the metal surfaces of the conductive elements and the capacitive element without melting them. Soldering makes a good electric connection and mechanical connection, too. Suitable solders are e.g. Sn/Pb/Ag/Sb (62/35,7/2/0.3) class Sn 62, melting point at 179° C., or In/Pb/Ag, (80/15/5) melting point at 149° C. (manufacturer Multicore Solder Ltd., U.K.). All solder compositions herein given are labelled as weight percent. These solders are pastes with a viscosity of usually more than 200,000 cP at 25° C. Because of this relatively high viscosity the solder paste is prevented from flowing even at higher operation temperatures.

Particularly preferred is the use of a thermoplastic adhesive with a softening temperature of about 150° C. together with InPbAg solder paste with a melting point of 149° C., or the use of a thermosetting adhesive with a polymerization temperature of 185° C. together with SnPbAgSb solder paste with a melting point of 179° C.

These preferred combinations of materials provide an excellent adjustment of the various process parameters during the single bonding step.

The capacitive elements are preferably metallized ceramic chips whose edges are not electrically conductive. Each metallized major side is facing to the appropriate conductive element. For electrical connection between them the solder alloy material is placed on the metallized sides of the capacitive element and/or the facing sides of the conductive element in a suitable quantity depending on the chip size. The solder, for instance, is laid by dotting or in a continous strip in the central zone on both sides of the chips and not less than 1 mm from the edge and/or in the mid area of the conductive elements. Quantity shall be suitable, for instance, 0.02 g per point or 0.1 g per linear cm. The chips are preferably placed in the centre of the conductive element. Solder, due to its viscosity, makes positioning of the capacitive element relative to the conductive element easier. The small quantity of solder cannot produce any short-circuiting during manufacturing operations, because solder remains within the middle of the capacitive element, well far away from the edges.

In a preferred embodiment of the invention dielectric elements are bonded to the outwardly facing or exposed surfaces of the conductive elements in order to insulate and to capsule the assembly. This external insulation is established during the above mentioned one hot pressing step. These outer dielectric elements are preferably a synthetic paper or a film strip. Preferably these elements have a dry adhesive layer on the internal sides. This thermosetting or thermoplastic adhesive is an acrylic, or epoxide or polyester adhesive.

There is also provided a multilayer conductive bar having one or more isolating layers between the conductive element and the capacitive element. This isolating layer, preferably an inner dielectric element, is bonded by the non-conductive adhesive to the conductive element and to the capacitive element. Both major sides of the inner dielectric element are covered preferably with a dry adhesive layer. This element comprises holes wherethrough electrical contact between the adjacent conductive element and the capacitive element is made by the solder paste or the preform welding material, which may be filled in these holes. The holes having a diameter of about 1 to 3 mm are centered in the mid area of the capacitive element, where the electrical connection should be performed.

In another embodiment of the invention, when capacitive elements do not fill all the conductive bar length, inner dielectric elements are placed within the empty extremities aside the capacitive elements and are bonded to the inwardly facing surfaces of the conductive elements. The bonding may be performed by the same adhesive as used for the outer dielectric elements. The adhesive may be a film layer on one or two sides of the dielectric elements. Preferably the inner dielectric element used as a spacer has the same thickness as the capacitive element and may be a synthetic paper or a film strip.

The invention also provides a modification of the method by manufacturing the high capacitive multilayer conductive bars in more than one step. For example, firstly soldering the capacitive element to the conductive elements and at the same time bonding the inner dielectric elements to the conductive elements and/or capacitive element, and subsequently externally coating the bonded elements with a protective and isolating material. The coating can be made, for instance, by means of epoxy or silicone resin, by dipping or by an electrostatic system.

High capacitance bus bars are useful in many applications. They are especially designed to fit under integrated circuits to save space and to feed the supplying current to the integrated circuits and/or to establish an electrical connection between two or more integrated circuits.

The main features of the invention are described in detail below with reference to the drawings.

FIG. 1 shows an exploded view of a high capacitive multilayer conductive bars,

FIGS. 2a+b show a sectional view along the line EE and a sectional view along the line AA in FIG. 1, respectively, and FIGS. 3a+b show an exploded view of an alternative embodiment and a sectional view along the line AA, respectively.

Referring to FIG. 1, bus bar 10, consists of ceramic chips 12 laid between the conductors 14 and 16, external dielectric elements 18 and 20 each one with thermosetting or thermoplastic dry adhesive 22 and 24. Said dry adhesive layers 22 and 24 after assembling shall be connected with the external side of the conductors 14 and 16. In the case that the external coating is made separately an epoxy or silicone resin is laid on said conductors. Barium or strontium titanate ceramic chips 12 are metallized on their major sides, the metal layer 12' being provided by well known methods. Spacing dielectric 13 and its dry adhesive 13' are placed on the empty sides of the bus bar between said conductors. A suitable quantity of the solder paste is placed on the metallized surfaces 12' of the capacitive elements 12 and/or on the internal side of the conductive elements 14 and 16. The conductive bars 14 and 16 are preferably made from tinned copper and/or brass with some pins 32 serving as a connection to the external circuitry. The bus bar 10, as said before, can be provided directly with external dielectric elements 18 and 20 and thermosetting and thermoplastic dry adhesive 22 and 24.

The bar 10 can be assembled together during one hot pressing step.

According to FIG. 2a the multilayer conductive bar is assembled altogether and it looks like a "sandwich". Between the conductive elements 14,16 with the sidewardly extending pins 32 is positioned the inner dielectric element 13 having dry adhesive surface layers 13'. The whole is covered from the outer dielectric elements 18, 20 which are mechanically connected to the conductive elements 14, 16 by the adhesive layers 22, 24. Every space within the conductive bars assembly is filled with the same adhesive. In the middle of the assembly there is shown the capacitive element 12 with the metallic surfaces 12' (FIG. 2b). The electrical connection is established by the solder 30 between the major sides of the capacitive element 12 and the conductive elements, which are positioned under and above the capacitive element 12. The other components correspond to those of FIG. 2a.

Referring to FIG. 3 the insulation between every chip inside the bus bar can be increased by using an inner dielectric electric element 113 which is a bit longer than the conductive elements. This inner dielectric element 113 having dry adhesive layers 113' on each major side comprises holes 31. The solder 30 is placed on the capacitive element 12 having metallized surfaces 12' in the mid area of the major sides and/or on the inwardly facing surfaces of the conductors in the positions corresponding to the holes. The holes 31 of the inner dielectric element 113 are adjusted to the mid area of the capacitive elements. So that electrical connection is made by solder through the holes between the conductive element 16 and the capacitive element 12. On top and base of the exploded view are shown the outer dieletric elements 18, 20 with the inwardly facing dry adhesive layers 22, 24 respectively.

In contrast to FIG. 2b, the bar according to FIG. 3b comprises an additional inner dielectric element 113 between the capacitive element 12 and the conductive element 16. The solder 30 connects the capacitive element 12 through the inner dielectric element hole with the conductive element 16. This alternative and the introduction of the solder preform, without changing the substantial characteristic of the product, stresses some qualities like better reliability, improved the process of manufacture, and provides more uniform electric characteristics.

The contact between the metallized ceramic chips and the conductor implies dielectric strip drilling, one or more holes 31 per chip center (diameter 1 to 3 mm) care shall be taken to avoid drilling where there is no chip. The dielectric strips are by 1 or 2 mm wider than the conductive element, they have a thickness of usually 50 $\mu$m; the thicker they are, the better insulation is requested. The strip material shall give a good insulation up to at least 150° C., or even up to 200° C., it can be a film, or aramide fiber.

The adhesive can be thermosetting or thermoplastic material, the activation temperature can be between about 150° C. and 200° C. During the process of manufacture, the drilled dielectric strip is placed on the first conductor already lying in the lamination die, in each hole shall be put 10 mg of solder paste to fill it sufficiently.

A kind of solder paste, for instance, is Sn/Pb/Ag/Sb 62/35.7/2/0.3 (manufacturer Multicore Solders Ltd. U.K.), with a melting point at 179° C., non activated flux type R or type Xersin 2000 or similar with best insulation quality. Another solder paste can be InPbAg 80/15/5 from same producer, with a melting point at 149° C.

Alternatively, a solder preform can be used.

The preform element shall be big enough to provide welding in all the sections of the whole square element, for instance, 1.5×1.5×0.2 mm without causing excess of melting material during the sealing of the component. In this case the solder flow can be avoided. Then the ceramic chips are laid on the holes filled with solder. The chips and the relative holes can be placed in the center of the bar or can be uniformly distributed all along the bar, in the second case a better uniformity in electrical parameters is achieved. The solder paste or preform welding is laid on the other metallized side of the chip, of the same type and quantity as above, always along the major axis. Solder leaking after melting shall be avoided. The above mentioned types of solder materials are indicative, other materials may be used if their characteristics are the same.

What is claimed is:

1. A method for manufacturing high capacitive multilayer conductive bars with:
    (a) at least two spaced conductive elements,
    (b) at least one capacitive element positioned between the conductive elements, (c) inner or outer dielectric elements positioned on at least one side of at least one conductive element,
(d) wherein the conductive, capacitive and dielectric elements are bonded to each other wherein (e) the mechanical connection between the conductive and dielectric elements is established by a non-conductive bonding material,
(f) the electrical connection between the conductive elements and the capacitive element is established by a soldering alloy material, and
(g) the bonding between the conductive, the capacitive, and the dielectric elements is performed in a single step.

2. A method according to claim 1, characterized by laminating the conductive elements, the capacitive element, and the dielectric elements with the solder alloy as well as the non-conductive bonding material during one hot pressing step.

3. A method according to claim 1, characterized in that the non-conductive bonding material is a thermosetting or a thermoplastic adhesive.

4. A method as claimed in claim 3, characterized in that the bonding via the thermosetting or the thermoplastic adhesive, respectively, is performed at the polymerization or the softening temperature, respectively, of the adhesive.

5. A method as claimed in claim 4, characterized in that the bonding is performed at a polymerization temperature of about 185° C. or at a softening temperature of about 150° C., respectively.

6. A method as claimed in claim 1, characterized in that the solder alloy material is a solder paste or a solder preform material.

7. A method as claimed in claim 6, characterized in that the solder paste or the solder preform have melting temperatures between 140° C. and 200° C.

8. A method as claimed in claim 7, characterized in that the solder paste consists of Sn/Pb/Ag/Sb (62/35.7/2/0.3) alloy with a melting point at 179° C.

9. A method as claimed in claim 7, characterized in that the solder paste consists of In/Pb/Ag (80/15/5) alloy with a melting point at 149° C.

10. A method as claimed in claim 1, characterized in that the capacitive element is a metallized ceramic chip.

11. A method as claimed in claim 1, characterized in that the solder alloy material is placed in a suitable quantity, preferably 0.02 g per point or 0.1 g per linear cm, on metallized sides of the capacitive element and/or opposite sides of the conductive elements.

12. A method as claimed in claim 6, characterized in that the viscosity of the solder paste or solder preform material allows an easy positioning of the capacitive element relative to the conductive elements.

13. A method as claimed in claim 1, characterized in that the dielectric elements are bonded to the exposed surfaces of the conductive elements.

14. A method as claimed in claim 1, characterized in that the inner dielectric element is bonded to the conductive element and to the capacitive element as an isolating layer between them.

15. A method as claimed in claim 14, characterized in that the inner dielectric element comprises holes positioned for making electrical contact between the conductive element and the capacitive element, and that the electrical contact is made by solder paste or solder preform material, which goes through the holes.

16. A method as claimed in claim 1, characterized in that an inner dielectric element is bonded to the conductive elements as a spacer.

17. A method for manufacturing high capacitive multilayer conductive bars comprising:
(a) at least two spaced conductive elements,
(b) at least one capacitive element positioned between the inner sides of the conductive elements
(c) dielectric elements positioned on the outer sides of the conductive elements,
(d) inner dielectric elements positioned between the inner sides of the conductive elements as spacers, which are provided adjacent to the capacitive element having the same thickness,
(e) wherein the conductive, capacitive and dielectric elements are bonded to each other, whereby
(f) the mechanical connection between the conductive and dielectric elements is established by a non-conductive bonding material,
(g) the electrical connection between the conductive elements and the capacitive element is established by a soldering alloy material, and
(h) the bonding between the conductive, the capacitive, and the dielectric elements is performed in a single step.

18. A method for manufacturing high capacitive multilayer conductive bars with:
(a) at least two spaced conductive elements,
(b) at least one capacitive element positioned between the conductive elements,
(c) inner and/or outer dielectric elements positioned on at least one side of at least one conductive element, wherein (d) the conductive, capacitive and dielectric elements are bonded to each other
(e) the mechanical connection between the conductive and dielectric elements is established by a non-conductive bonding material,
(f) the electrical connection between the conductive elements and the capacitive element is established by a soldering alloy material,
(g) the bonding between the conductive, the capacitive, and the dielectric elements is performed in a first step, and
(h) the bonded element is subsequently externally coated with a protective and isolating material in a second step.

19. A method for manufacturing high capacitive multilayer conductive bars comprising:
(a) at least two spaced conductive elements,
(b) at least one capacitive element positioned between the inner sides of the conductive elements,
(c) dielectric elements positioned on the outer sides of the conductive elements,
(d) at least one inner dielectric element comprising holes positioned between the inner side of the conductive elements and the outer surface of the capacitive elements as an isolating layer between then whereby the holes are positioned for making electrical contact between the conductive element and the capacitive element,
(e) wherein the conductive, capacitive and dielectric elements are bonded to each other, whereby
(f) the mechanical connection between the conductive and dielectric elements is established by a non-conductive bonding material,
(g) the electrical connection between the conductive elements and the capacitive element is established by a soldering alloy material which goes through the holes, and
(h) the bonding between the conductive, the capacitive, and the dielectric elements is performed in a single step.

* * * * *